(12) United States Patent
Kazuno

(10) Patent No.: US 9,111,642 B2
(45) Date of Patent: Aug. 18, 2015

(54) NON-VOLATILE MEMORY DEVICE AND ELECTRONIC APPARATUS

(71) Applicant: SEIKO EPSON CORPORATION, Tokyo (JP)

(72) Inventor: Masataka Kazuno, Kofu (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/074,159

(22) Filed: Nov. 7, 2013

(65) Prior Publication Data

US 2014/0063999 A1 Mar. 6, 2014

Related U.S. Application Data

(62) Division of application No. 13/334,321, filed on Dec. 22, 2011, now Pat. No. 8,611,165.

(30) Foreign Application Priority Data

Dec. 28, 2010 (JP) ................................. 2010-292457

(51) Int. Cl.
| | |
|---|---|
| *G11C 7/00* | (2006.01) |
| *G11C 29/02* | (2006.01) |
| *G11C 29/36* | (2006.01) |
| *G11C 29/38* | (2006.01) |
| *G11C 29/44* | (2006.01) |

(52) U.S. Cl.
CPC .............. *G11C 29/026* (2013.01); *G11C 29/36* (2013.01); *G11C 29/38* (2013.01); *G11C 29/44* (2013.01)

(58) Field of Classification Search
CPC ....... G11C 29/50; G11C 11/401; G11C 19/02
USPC .................... 365/201, 207, 189.12
See application file for complete search history.

(56) References Cited

U.S. PATENT DOCUMENTS

| | | | |
|---|---|---|---|
| 5,243,569 | A | 9/1993 | Atsumi |
| 5,428,574 | A * | 6/1995 | Kuo et al. ..................... 365/201 |
| 6,275,961 | B1 | 8/2001 | Roohparvar |
| 6,434,068 | B1 | 8/2002 | Harada et al. |
| 7,495,984 | B2 | 2/2009 | Kim et al. |
| 2004/0042293 | A1 | 3/2004 | Ogino |

FOREIGN PATENT DOCUMENTS

| | | |
|---|---|---|
| JP | A-03-272100 | 12/1992 |
| JP | A-2003-272399 | 9/2003 |
| JP | A-2006-018341 | 1/2006 |
| JP | A-2008-210467 | 9/2008 |

OTHER PUBLICATIONS

Aug. 7, 2013 Notice of Allowance issued in U.S. Appl. No. 13/334,321.

* cited by examiner

*Primary Examiner* — Son Dinh
(74) *Attorney, Agent, or Firm* — Oliff PLC

(57) ABSTRACT

A non-volatile memory device is provided, which includes a first block for storing a first data group including a test data, a second block for storing a second data group including a complementary data to the first data group, a differential sense amplifier for generating an output value based on a difference between two input signals, a diagnostic circuit for performing a failure diagnosis using a value from the differential sense amplifier, and a control circuit which performs control such that a signal based on the test data and the complementary data is set to the input signal of the differential sense amplifier and the diagnostic circuit executes a failure diagnosis of the differential sense amplifier. The non-volatile memory device performs a failure diagnosis with high reliability capable of distinguishing between a failure of sense amplifier and a failure of a memory cell.

14 Claims, 9 Drawing Sheets

NON-VOLATILE MEMORY DEVICE AND ELECTRONIC APPARATUS

This is a Division of application Ser. No. 13/334,321 filed Dec. 22, 2011, and claims priority to Japanese Patent Application No. 2010-292457, filed on Dec. 28, 2010. The prior applications, including the specifications, drawings and abstracts are incorporated herein by reference in their entirety.

BACKGROUND

1. Technical Field

The present invention relates to a non-volatile memory device and an electronic apparatus.

2. Related Art

High reliability is demanded for electronic apparatus mounted on a vehicle, an airplane, a ship, a train, or the like in which safety is required. Such an electronic apparatus may include plural non-volatile memory devices that store the same data (or data in which 0 and 1 are inverted). The data is, for example, several tens of bits of data for adjusting an analog circuit (hereinafter, adjustment data). In this case, it is possible to increase the data reliability by a mutual collation overall bits of data from different non-volatile memory devices when the data is read.

Then, if there is a mismatch of data, for example, it is possible to respond appropriately by providing a failure diagnosis function such as outputting a failure diagnosis signal. For example, JP-A-2006-18341 discloses an accurate failure diagnosis function which performs a double check based on a calculated checksum for each area.

However, along with an increase of non-volatile memory device capacity, if handling data increases (for example, hundreds of bits), then the size of the circuit for collation all the data bits may increase. In addition, along with a high integration of the non-volatile memory device, it is possible to integrate a combined capacity of plural non-volatile memory devices into a single non-volatile memory device. Therefore, it is demanded that a single chip non-volatile memory device have a failure diagnosis function and be capable of outputting data with high reliability.

In this case, by storing data in the plural memory blocks, it is possible to provide a plurality of data in which mutual collation is possible. However, in order to accurately diagnose a failure of each memory cell included in the memory block, it is necessary to first perform a failure diagnosis of a read circuit, called a sense amplifier. In the non-volatile memory device used in an electronic apparatus mounted on vehicles or the like, it is necessary to specify a failure area in the event of a failure. Therefore, it is necessary to perform diagnosis so as to distinguish between the failure of the sense amplifier and the failure of the memory cell.

SUMMARY

An advantage of some aspects of the invention is to provide a non-volatile memory device which performs a failure diagnosis with high reliability and is capable of distinguishing between the failure of sense amplifier and the failure of memory cell.

(1) An aspect of the invention is directed to a non-volatile memory device including: a first block including first memory cells that store a first data group including test data on a single-bit basis; a second block including second memory cells that store a second data group including data complementary to each data of the first data group on a single-bit basis; at least one differential sense amplifier that receives a first input signal and a second input signal and generates an output value based on a difference therebetween; a diagnostic circuit that performs a failure diagnosis using the output value of the differential sense amplifier; and a control circuit that performs selection of the first and second input signals and control of the diagnostic circuit, wherein the control circuit performs control such that a signal based on the test data is set to the first input signal, a signal based on the data complementary to the test data out of the second data group is set to the second input signal, and the diagnostic circuit executes a sense amplifier test which is a failure diagnosis of the differential sense amplifier, and the diagnostic circuit executes a sense amplifier test using all output values of the differential sense amplifier.

(2) In the non-volatile memory device, the test data may be a fixed value.

According to the above configurations of the invention, by executing a sense amplifier test, it may distinguish between the failure of the sense amplifier and the failure of memory cell. In addition, by executing the sense amplifier test using a test data of the first data group and a complementary data to the test data out of second data group, it is possible to perform a failure diagnosis with high reliability. In this case, the test data may be a fixed value without rewriting, and it may be 1 corresponding to a true of the logical value or 0 corresponding to a false of the logical value.

The first data group is stored in the first memory cell in 1 bit units. In other words, the value stored in the single first memory cell may be 0 or 1. The second data group complements each data of the first data group. The "complementary" means combining 1 with 0 and 0 with 1. Each of the first memory cells has a corresponding second memory cell. For example, if 0 is stored in the first memory cell, 1 is stored in the corresponding second memory cell. As a result, data multiplexing (duplication) is performed by the first and second blocks substantially. By duplication, it is possible to perform the failure diagnosis with high reliability.

One or more differential sense amplifiers may be included. For all sense amplifier tests, the signal based on the test data is set to the first input signal, and the signal based on the complementary data to the test data is set to the second input signal. Since the signal based on the complementary data is input as the second input signal, it is possible to increase an operation margin compared to a case of using a reference signal. In addition, for example, the input signal may be a current or a voltage.

The diagnostic circuit performs the sense amplifier test using the output values of the overall differential sense amplifiers. Specifically, as an expected value of the output from the differential sense amplifier is 1, a diagnosis may be performed by a NAND circuit.

By this sense amplifier test, the failure diagnosis of the sense amplifier may be performed before the failure diagnosis of the memory cell. That is, according to the aspect of the invention, it is possible to distinguish between the failure of the sense amplifier and the failure of the memory cell. For example, if it is diagnosed that a failure has occurred in the sense amplifier, the failure diagnosis signal may be output without performing the failure diagnosis of the memory cell. In addition, the data duplication is performed by using the data complementary to the test data. Since the operation margin of the differential sense amplifier is taken larger, it is possible to perform the failure diagnosis of the differential sense amplifier with high reliability.

(3) The non-volatile memory device may further include a reference signal source for outputting a reference signal, wherein the control circuit may perform control such that the diagnostic circuit executes first to third memory cell tests after executing the sense amplifier test, in a case of the first memory cell test, a signal based on focus data which is data of one bit other than the test data out of the first data group is set to the first input signal, and the reference signal is set to the second input signal, in a case of the second memory cell test, the reference signal may be set to the first input signal, and a signal based on a complementary data which complements the focus data out of the second data group may be set to the second input signal, in a case of the third memory cell test, a signal based on the focus data may be set to the first input signal, and a signal based on the complementary data is set to the second input signal, and the focus data may change to repeat the first to third memory cell tests until a predetermined condition is satisfied, and wherein the diagnostic circuit may execute a first memory cell test which is a failure diagnosis of a first memory cell which stores the focus data, may execute a second memory cell test which is a failure diagnosis of a second memory cell which stores the complementary data, and may execute a third memory cell test which is a failure diagnosis of the second memory cell which stores a first memory cell which stores the focus data and the complementary data after executing the first and second memory cell tests.

According to this configuration of the invention, by executing the first to third memory cell tests after the sense amplifier test is executed, it is possible to perform a failure diagnosis of the memory cell distinguishably from a failure of the sense amplifier. Using three memory cell tests, it is possible to perform the failure diagnosis with high reliability. In addition, since the memory cell test compares each bit instead of comparing all bits of the data, it is possible to suppress the circuit size increasing. In addition, "memory cell test" means the failure diagnosis of the memory cell. Hereinafter, it is also used as a generic term for the first to third memory cell tests.

Furthermore, in the following description, a single bit data stored in the first memory cell to be diagnosed is called "focus data", and a single bit data stored in the second memory cell which is complementary thereto is called "complementary data". Since the differential sense amplifier is used as a read circuit, the complementary data instead of the same data as the focus data is used.

Among the first to third memory cell tests, the reference signal is used as one of the input signals of the differential sense amplifier in the first and the second memory cell tests. The reference signal serves as a reference signal for determining whether the data stored in the memory cell is 0 or 1. For example, the reference signal is given from the reference signal source which is a constant current source. The differential sense amplifier compares the reference signal and the signal from the memory cell, determines whether the data stored in the memory cell is 0 or 1, and outputs a value depending on the result.

The first memory cell and its complementary second memory cell are independent memory cells. Therefore, there may be a failure in which 1 or 0 is stored in both the memory cells. In this case, if the data of these memory cells are just simply compared, it is likely that the differential sense amplifier may output an expected value by chance due to a minute signal difference so that the failure of the memory cell may not be detected. Therefore, by performing the first and the second memory cell tests, a robust failure diagnosis of the memory cell may be performed.

In the first memory cell test, the signal based on the focus data of the first data group is set to the first input signal, and the reference signal is set to the second input signal. In this case, it is possible to perform the failure diagnosis of the first memory cell which stores the focus data. In the second memory cell test, the reference signal is set to the first input signal, and the signal based on the complementary data which complements the focus data out of the second data group is set to the second input signal. In this case, it is possible to perform the failure diagnosis of the second memory cell which stores the complementary data. In these memory cell tests, a single read is performed in which the data stored in the memory cell is read by only one of the input signals. In addition, the first and second memory cell tests may be performed using different reference signals.

In the third memory cell test among the first to third memory cell tests, the signal based on the focus data is set to the first input signal, and the signal based on the complementary data is set to the second input signal. In the third memory cell test, it is possible to perform the failure diagnosis of the first memory cell which stores the focus data and the second memory cell which stores the complementary data. In this case, a rear-stage circuit may use the value output from differential sense amplifier. In other words, in the third memory cell test, a typical data reading may be performed.

In the third memory cell test, for example, it is possible to detect inversion of the data caused by a failure or the like. In this case, the previously read data may be used. The third memory cell test is preferably executed after the first and the second memory cell test which compares each signal based on the focus data and the complementary data with the reference signal.

In this manner, for the memory cells which store the focus data representing a single bit data and the complementary data, it is possible to perform a failure diagnosis with high reliability and certainty by the first to third memory cell tests.

The focus data of the first to third memory cell tests are not test data used in the sense amplifier test. For example, a failure diagnosis is directly performed for the memory cell which stores adjustment data (and complementary data thereof) used in the rear-stage circuit. The sense amplifier test is an independent failure diagnosis, and it is possible to perform the failure diagnosis of the memory cell distinguishably from the failure of the sense amplifier.

In the memory cell test, the first to third memory cell tests are repeated while changing the focus data. In this case, as a result of comparing and determining every single bit of data, for example, it is unlikely that a circuit size will increase in proportion to the increase of the adjustment data amount. In addition, in this example, the failure diagnosis of all the adjustment data may be a termination condition (predetermined condition) of the memory cell test. Furthermore, the termination condition may be the power off in applications that always perform failure diagnosis. In this case, after the failure diagnosis of the last adjustment data is performed, the process may return to the initial data, and the process such as performing the failure diagnosis may be executed repeatedly.

(4) In the non-volatile memory device, the diagnostic circuit may execute each of the first to third memory cell tests in a single clock cycle.

(5) In the non-volatile memory device, the diagnostic circuit may change a failure diagnosis signal if it is diagnosed that a failure occurs in any one of the sense amplifier test and the first to third memory cell tests.

According to the configurations of the invention, it is possible to reduce an execution time of the failure diagnosis using the diagnosis circuit. In applications for executing such a failure diagnosis before performing a typical operation, the time from the power on to the typical operation may be shortened. First, by executing the first to third memory cell tests at every single clock cycle, it is possible to perform the failure diagnosis for the memory cells which store a single bit of data in three clocks (including the memory cell for storing the focus data and the memory cell for storing the complementary data). Therefore, it is possible to reduce the execution time of the failure diagnosis. In addition, if the diagnostic circuit diagnoses that a failure occurs in any one of the sense amplifier test and the first to third memory cell tests, for example, the failure diagnosis signal changing 0 to 1 may be output. If, for example, a user, the CPU, or the like existing in the outer side of the non-volatile memory device detects a change of the failure diagnosis signal, it is possible to take an appropriate action such as performing the failure diagnosis again or resetting. In addition, after the failure diagnosis signal is changed immediately, the subsequent failure diagnosis may be aborted. In addition, the failure diagnosis signal is not necessarily output. For example, the failure diagnosis signal may be mapped to the status register.

(6) The non-volatile memory device described above may further include a register which holds a value based on an output value of the differential sense amplifier if the third memory cell test is executed, and the diagnostic circuit may perform a failure diagnosis using the value held in the register.

(7) In the non-volatile memory device, the diagnostic circuit may execute the third memory cell test by selecting one of an output value of the differential sense amplifier and values held in the register and perform the third memory cell test using each value held in the register only once after power on.

According to the configurations of the invention, it is possible to diagnose a register failure which holds the data used by the rear-stage circuit in practice. For example, for the adjustment data used in the rear-stage circuit, the value output from the differential sense amplifier is held in the register when the third memory cell test in which a typical data reading is performed is executed. Although this value is preferably the same as the focus data, the value may be an inverted value. In addition, one of the values corresponding to the focus data is selected out of values held in this register and is input to the diagnostic circuit. In addition, the diagnostic circuit may diagnose a failure including the register. The register may be provided externally to the non-volatile memory device.

In this case, the diagnostic circuit may select the selected register value and the value from the differential sense amplifier based on the control signal from the control circuit. For example, the value held in the register may be relatively less sensitive to noise. In this case, the diagnostic circuit after power on executes a failure diagnosis using the register value only once, and after the diagnosis for all bits is terminated, the diagnostic circuit may be switched to execute the failure diagnosis using the value from the differential sense amplifier. Here, a timing of switching may be at any point, and multiple switching may be performed. The value from the differential sense amplifier may also be used before the register value is used.

(8) Another aspect of the invention is directed to an electronic apparatus including the non-volatile memory device described above.

According to the aspects the invention, the non-volatile memory device included in the electronic apparatus may perform the failure diagnosis with high reliability by distinguishing between the failure of the sense amplifier and the failure of the memory cell. For this reason, it is possible to perform accurate failure detection and provide the electronic apparatus with an easy failure analysis.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
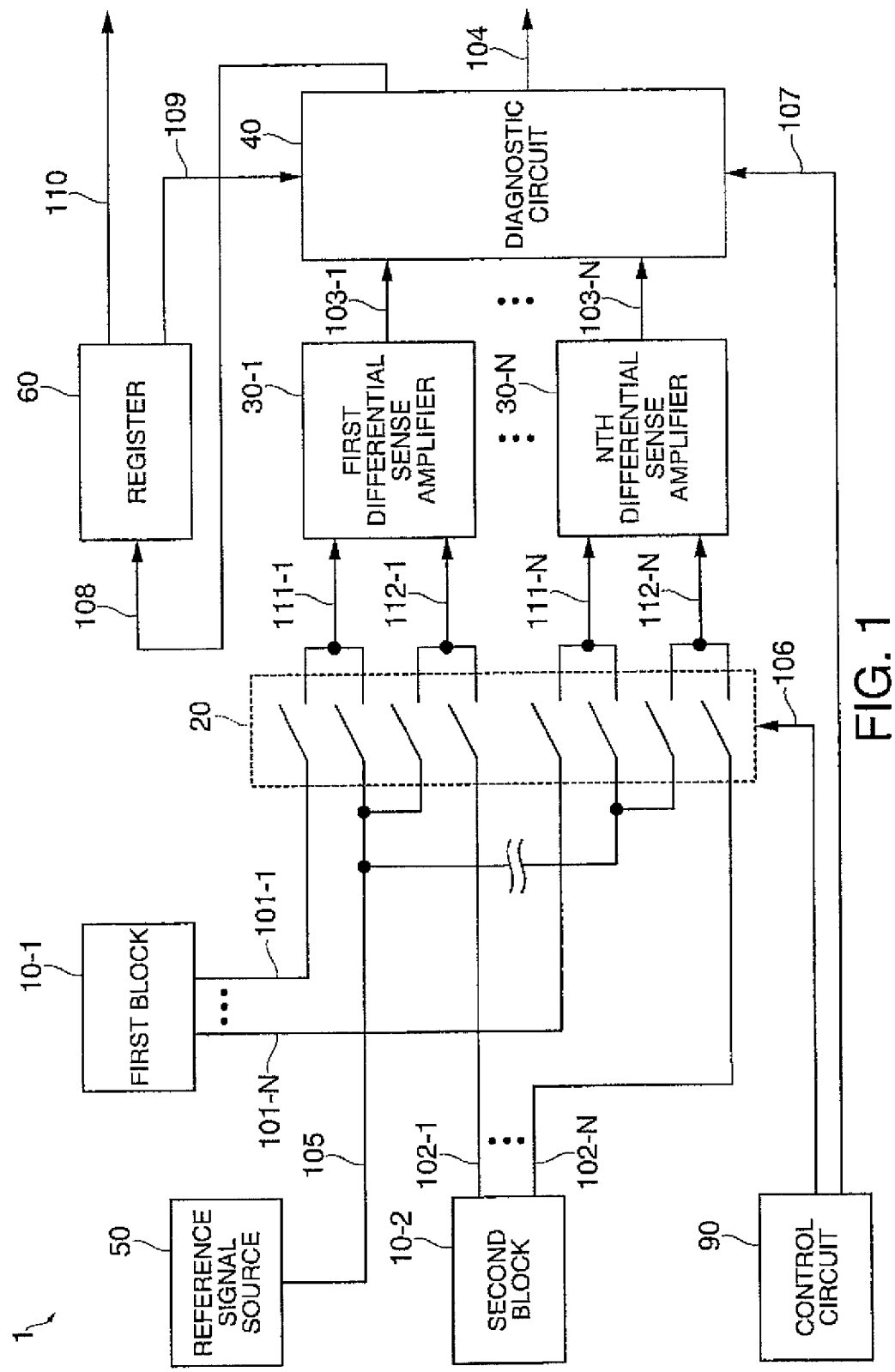
FIG. 1 is a block diagram illustrating a non-volatile memory device according to a first embodiment.

Hereinafter, embodiments of the invention will be described in detail with reference to the accompanying drawings. In the description of modification or application examples, like reference numerals denote like elements as in the first embodiment, and description thereof will not be repeated.

1. First Embodiment 1.1 Configuration of Non-Volatile Memory Device

An first embodiment of the invention will now be described with reference to FIGS. 1 to 7B. FIG. 1 is a block diagram illustrating a non-volatile memory device 1 of the present embodiment. The non-volatile memory device 1 includes a first block 10-1, a second block 10-2, a switch 20, first to Nth differential sense amplifiers 30-1 to 30-N, a diagnostic circuit 40, a reference signal source 50, a register 60, and a control circuit 90. The non-volatile memory device 1 includes at least one differential sense amplifier, where N denotes a natural number. In the case of N=1, the first and Nth differential sense amplifiers 30-1 and 30-N are the same differential sense amplifier. In the present embodiment, it is assumed that N=4.

The first and second blocks 10-1 and 10-2 are memory blocks which are a set of memory cells. A first memory cell included in the first block 10-1 stores a first data group including test data on a single-bit basis. In the present embodiment, the test data is a fixed value of 1, and the test data of which the number is equal to or more than the number (N) of differential sense amplifiers are provided. In the present embodiment, N=4, for example, 128 test data are prepared. In the present embodiment, the first data group includes, in addition to the test data, for example, 512 bits of adjustment data. The adjustment data of 512 bits may be updated in a batch, and the updated data are also written into the first memory cell.

A second memory cell included in the second block 10-2 stores data complementary to the first data group including the test data. "Complementing" means an inversion of the value, for example, takes 1 for 0. In the present embodiment, the data complementary to the test data is 0. In addition, each complementary data of the adjustment data included in the first data group is also stored in the second memory cell on a single-bit basis. When the adjustment data is updated, the data complementary to the updated data is also written to the second memory cell.

Although the non-volatile memory device 1 of the present embodiment is a metal oxide nitride oxide silicon (MONOS) type non-volatile memory, it may be a floating gate type non-volatile memory. Here, a case where a pair read, in which the focus data stored in one of the first memory cells and the complementary data stored in the corresponding second memory cell are simultaneously read, is performed will be considered. In this case, the memory cell for storing the focus data is selected by controlling a word line, a bit line, and a source line in the first and second blocks 10-1 and 10-2. A current flows through the bit line depending on whether the focus data is 0 or 1. The current according to the focus data is input to any one of the first to Nth differential sense amplifiers 30-1 to 30-N as one of internal signals 101-1 to 101-N. Then, the current according to the complementary data may be input to the same differential sense amplifier as any one of internal signals 102-1 to 102-N. In addition, which of the internal signals and the differential sense amplifiers is selected depending on the addresses of the complementary data and the focus data is uniquely determined.

The reference signal source 50 provides a reference signal 105 for allowing the differential sense amplifier to determine whether the data stored in the memory cell is 0 or 1. In the present embodiment, the reference signal source 50 may be a constant current source, and the reference signal 105 may be a constant current.

The switch 20 selects input signals of the first to Nth differential sense amplifier 30-1 to 30-N from the internal signals 101-1 to 101-N, the internal signals 102-1 to 102-N, and the reference signal 105. Each of the first to Nth differential sense amplifiers 30-1 to 30-N receives first input signals 111-1 to 111-N and second input signals 112-1 to 112-N as the input signal. In addition, each switch included in the switch 20 is turned on or off appropriately by the control circuit 90.

Each of the first to Nth differential sense amplifiers 30-1 to 30-N generates output values 103-1 to 103-N based on a difference between two input signals. For example, the first differential sense amplifier 30-1 generates the output value 103-1 based on the difference between the first input signal 111-1 and the second input signal 112-1. In the present embodiment, the output value of the differential sense amplifier is 0 or 1. Then, for example, if the focus data is 1, and the complementary data is 0, and if the failure does not occur, the output value of the differential sense amplifier is 1. That is, the same value of the focus data is output.

The diagnostic circuit 40 performs a sense amplifier test and first to third memory cell tests based on output values 103-1 to 103-N of the first to Nth differential sense amplifier 30-1 to 30-N. Then, if the any of these tests diagnoses that a failure occurs, a failure diagnosis signal 104 changing 0 to 1 is output. In addition, a failure detection of the register 60 may be performed which receives a diagnosis target register value 109 corresponding value to the focus data from the register 60.

The register 60 receives read data 108 which is a value corresponding to the focus data from the diagnostic circuit 40. Then, the old data is substituted with the read data 108, and the register value 110 is output to the rear-stage circuit. In the present embodiment, the register value 110 is, for example, data of 512 bits. Among them, the register value corresponding to the read data 108 is output separately as the diagnosis target register value 109.

The control circuit 90 performs selection of first input signals 111-1 to 111-N and second input signals 112-1 to 112-N and control of the diagnostic circuit 40 in order to appropriately perform the failure diagnosis. The control circuit 90 controls the ON/OFF state of each switch included in the switch 20 using a control signal 106 and controls the diagnostic circuit 40 using a control signal 107. In addition, the control circuit may control the first block 10-1, the second block 10-2, and the reference signal source 50 directly or indirectly using a control signal (not shown). The first block 10-1 and the second block 10-2 may be controlled such that, for example, the signal based on the focus data needed for the failure diagnosis, the complementary data, the test data, and the like are appropriately output. In addition, the reference signal source 50 may be controlled to change the level of the reference signal depending on the type of failure diagnosis, for example. The control circuit 90 may be included in the diagnostic circuit 40, or only a control signal may be input from the outer side of the non-volatile memory device 1.

1.2. First Block and Second Block

Figure 2A:
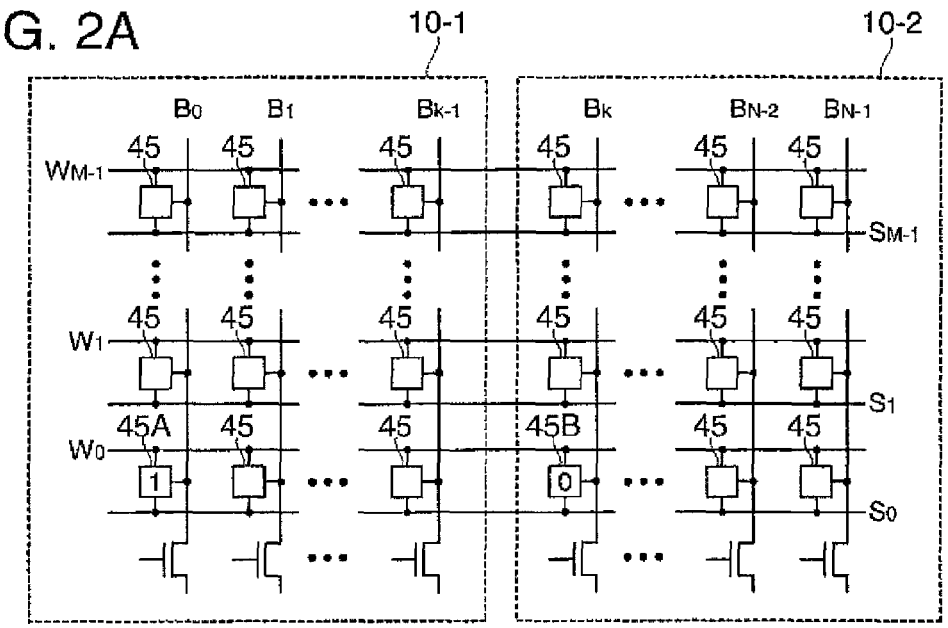
FIG. 2A and FIG. 2B are explanatory diagrams of first and second blocks.
Figure 2B:
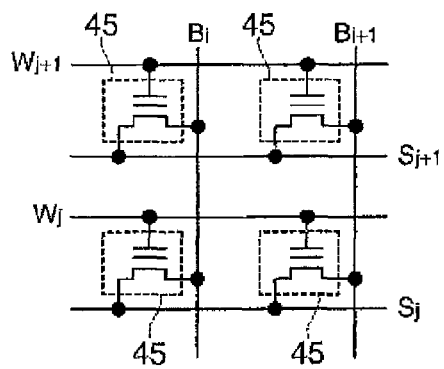

FIG. 2A and FIG. 2B are explanatory diagrams illustrating the first block 10-1 and the second block 10-2. In addition, like reference numerals denote like elements as in FIG. 1, and description thereof will be omitted.

FIG. 2A illustrates a state that arranged memory cells 45 are divided into the first block 10-1 and the second block 10-2. The first block 10-1 and the second block 10-2 may be separated physically or logically. The memory cells 45 are arranged in intersections between N bit lines $B_0$ to $B_{N-1}$ and M word lines $W_0$ to $W_{M-1}$. In addition, M source lines $S_0$ to $S_{M-1}$ are wired in parallel with the word lines $W_0$ to $W_{M-1}$ and connected to the memory cells 45. The bit lines $B_0$ to $B_{N-1}$, the word lines $W_0$ to $W_{M-1}$, the source lines $S_0$ to $S_{M-1}$, may be driven, for example, by a drive circuit (not shown) so that a current depending on the value stored in the selected memory cell 45 flows into the bit line.

The first block 10-1 and the second block 10-2 include the same number of memory cells. For example, if the first memory cells included in the first block 10-1 are for 1024 bits, the second memory cells included in the second block 10-2 are for 1024 bits. In FIG. 2A, k used as a subscript of the bit line satisfies k=N/2. In addition, there are second memory cells that are paired with each of the first memory cells. If the data (focus data) is stored in one of first memory cells, the complementary data which complements the focus data is stored in the corresponding second memory cell. When the focus data is read, the complementary data is also read simultaneously.

Here, one of the memory cells 45 is used as a memory cell 45A. The memory cell 45A is included in the first block 10-1 and stores 1 as the focus data. In addition, a memory cell which is a pair with the memory cell 45A is used as the memory cell 45B. The memory cell 45B is included in the second block 10-2 and stores 0 as the complementary data. Although a single memory cell 45A is illustrated in the example of FIG. 2A, there are second memory cells which store the complementary data for all of the first memory cells which store data of 0 or 1.

FIG. 2B is a specific example illustrating the memory cell 45 by enlarging a portion of FIG. 2A. In the present embodiment, the non-volatile memory device 1 is a MONOS type non-volatile memory and stores data by accumulating charges in the trap of the insulation film (nitride film) interposed between the oxide films. The MONOS type non-volatile memory has little charge leakage even when there is a defect in the oxide film between a substrate and the nitride film because the nitride film is an insulation film. For this reason, it is possible to make the oxide film thin and facilitate miniaturization. Furthermore, it may be possible to use a floating gate type non-volatile memory.

Figure 2C:
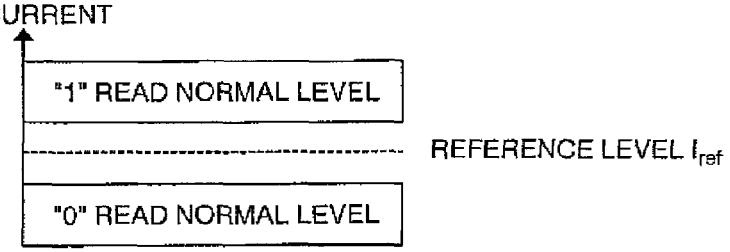
FIG. 2C is a diagram illustrating a reference signal.

FIG. 2C illustrates a method of determining the data stored in the memory cell 45 based on the difference between the first and second input signals in each differential sense amplifier 30-1 to 30-N. In the present embodiment, differential sense amplifiers 30-1 to 30-N are differential current type sense amplifiers. In addition, the first input signal is input to a positive input terminal, and the second input signal is input to a negative input terminal. Here, if the data is read from the memory cell which stores 1, the current greater than reference level $I_{ref}$ flows in the bit line. In addition, if the data is read from the memory cell which stores 0, the current smaller than the reference level $I_{ref}$ flows in the bit line. For example, a constant current of the reference level $I_{ref}$ may be set to the second input signal, and the current of bit line connected to the selected memory cell may be set to the first input signal. In this case, the output value of the differential sense amplifier becomes 1 if 1 is stored as the data, and the output value of the differential sense amplifier becomes 0 if 0 is stored as the data.

In the present embodiment, in the first memory cell for storing the focus data, there is the second memory cell for storing the complementary data. If the focus data is read, the complementary data is also read simultaneously. In this regard, the signal based on the focus data is input as the first input signal and the signal based on the complementary data is input as the second input signal. In this case, if there is no failure in the memory cell, the differential sense amplifier generates the output value corresponding to the focus data. That is, the output value of the differential sense amplifier is 0 if the focus data is 0, and the output value of the differential sense amplifier is 1 if the focus data is 1.

In the present embodiment, the control circuit 90 may select the first and second input signals using the switch 20 depending on the failure diagnosis. Therefore, it is possible to perform the failure diagnosis with high reliability by appropriately changing a combination of these input signals.

1.3. Diagnostic Circuit

Figure 3:
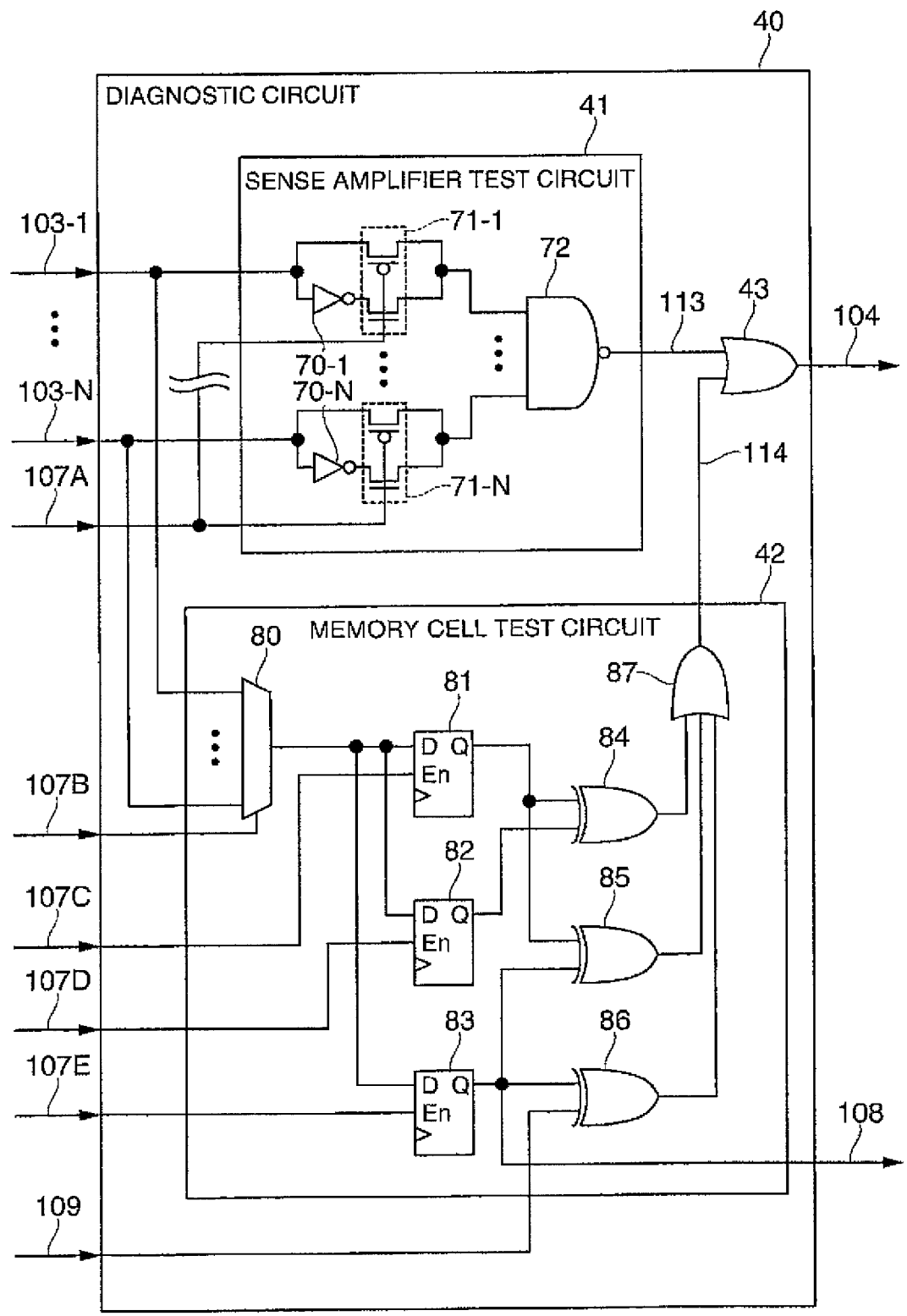
FIG. 3 is a block diagram illustrating a diagnostic circuit according to the first embodiment.

FIG. 3 is a block diagram illustrating the diagnostic circuit 40 according to the present embodiment. The diagnostic circuit 40 includes a sense amplifier test circuit 41 which performs the failure diagnosis of the sense amplifier and a memory cell test circuit 42 which performs the failure diagnosis of the memory cell. In addition, control signals 107A to 107E are divided depending on a function of the control signal 107 of FIG. 1.

The sense amplifier test circuit 41 diagnoses whether or not all of output values 103-1 to 103-N of the differential sense amplifiers 30-1 to 30-N match expected values. Here, it is assumed that the expected value of output values 103-1 to 103-N of differential sense amplifiers 30-1 to 30-N is 1. In this case, if the output values match the expected value, a sense amplifier failure diagnosis signal 113 which is an output of an NAND circuit 72 becomes 0. If there is any failure in the differential sense amplifiers 30-1 to 30-N, the sense amplifier failure diagnosis signal 113 becomes 1. If the expected value of output values 103-1 to 103-N of differential sense amplifiers 30-1 to 30-N is 0, an inversion may be made by inverters 70-1 to 70-N. In this case, the sense amplifier test circuit 41 may include, for example, switches 71-1 to 71-N selected by the control signal 107A.

The memory cell test circuit 42 includes flip-flops 81 to 83 for holding each output value of the differential sense amplifiers used in the first to third memory cell tests described later. In the present embodiment, the presence or absence of a failure may be determined by XOR circuits 84 to 86 based on the values held in flip-flops 81 to 83. A memory cell failure diagnosis signal 114 is changed to 1 by an OR circuit 87 if there is at least one failure. In addition, in the memory cell test, a failure diagnosis of a specific memory cell is performed. Therefore, the output value necessary for the failure diagnosis is selected by a selection device 80 out of output values 103-1 to 103-N of the differential sense amplifiers 30-1 to 30-N. In this case, the control signal 107B may be a selection signal. The control signals 107C to 107E control input timings of each flip-flop 81 to 83. Therefore, it is possible to perform the first to third memory cell tests in a time-divisional manner.

The memory cell test circuit 42 performs a failure diagnosis in the third memory cell test and outputs the output value from the differential sense amplifier held in the flip-flop 83 into the rear-stage register 60 (refer to FIG. 1). The value of the flip-flop 83 at this moment corresponds to the focus data stored in the memory cell which is the diagnosis target. That is, the read data 108 becomes the same value as the focus data if there is no failure. After the read data 108 is written to the register 60, the read data is input to the memory cell test circuit 42 as the diagnosis target register value 109 which is a target of the failure diagnosis (refer to FIG. 1). For this reason, the XOR circuit 86 can diagnose whether or not writing to the register 60 is appropriately performed. In addition, XOR circuits 84 to 85 will be described later.

The diagnostic circuit 40 outputs a failure diagnosis signal 104 which changes to 1 when it is diagnosed that there is a failure in one of the sense amplifier failure diagnosis signal 113 and the memory cell failure diagnosis signal 114 using an OR circuit 43. In addition, all of the sense amplifier failure diagnosis signal 113, the memory cell failure diagnosis signal 114, and the failure diagnosis signal 104 may be held in the flip-flop once. That is, the flip-flop may be inserted to these signals in FIG. 3.

Next, the sense amplifier test and the first to third memory cell tests according to the non-volatile memory device 1 of the present embodiment will be sequentially described.

1.4. Sense Amplifier Test 1.4.1 Test Data

Figure 4A:
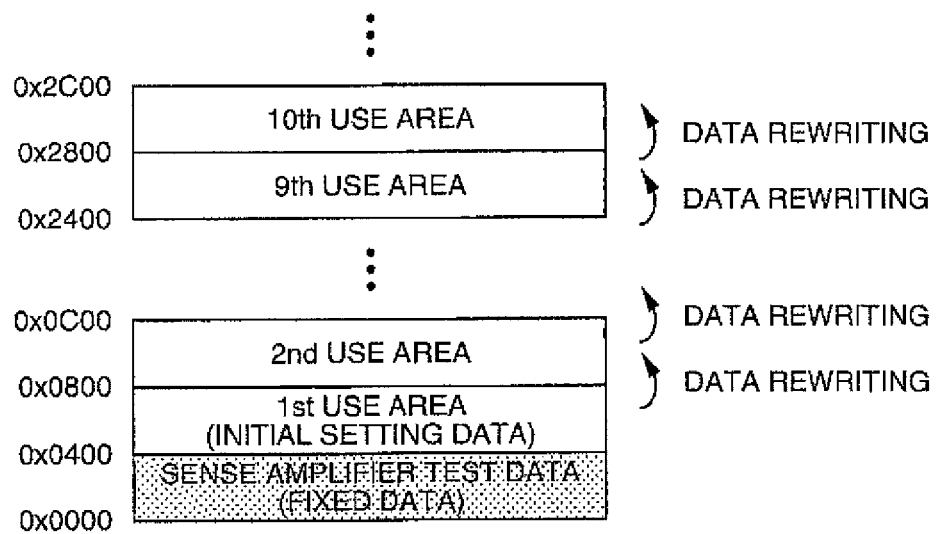
FIG. 4A and FIG. 4B are diagrams illustrating examples of a memory map.
Figure 4B:
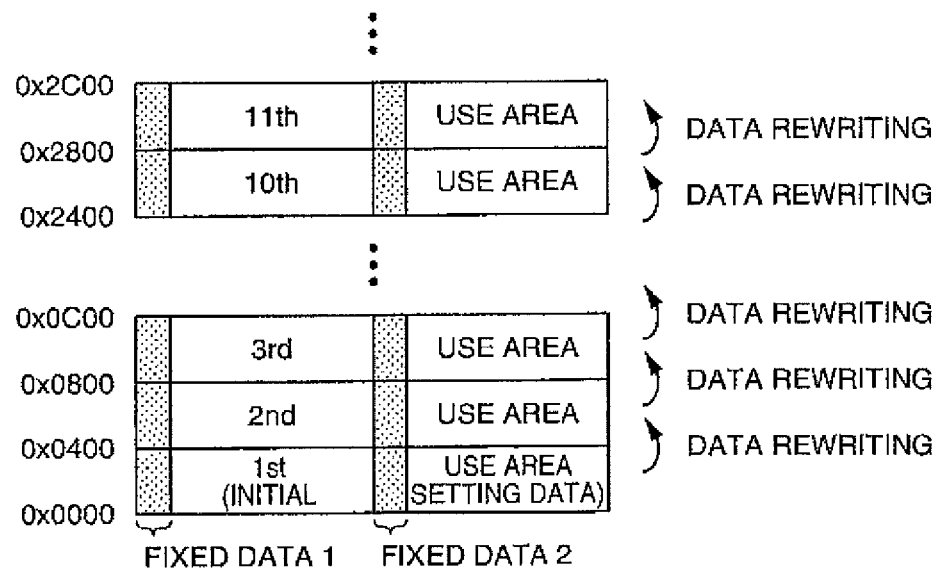

FIG. 4A and FIG. 4B are diagrams illustrating examples of a memory map of the test data and the like. The test data is data used in the sense amplifier test, and is used in combination with the data complementary to the test data. In the present embodiment, the test data is a fixed value of 1 and complementary data thereof is a fixed value of 0.

In the present embodiment, the non-volatile memory device with high reliability is implemented by writing the data only once in the single address. In the present embodiment, for example, adjustment data of 512 bits are read from the memory cell and used in the rear-stage circuit. In this case, since any one bit of data is duplicated and stored in the memory cell, a data area of 2 bits (the focus data and the complementary data thereof) is required. Therefore, in this example, adjustment data of 512 bits are stored using a data area of 1024 bits. Then, if the rewriting is performed, new data is written to an area of 1024 bits different from the current area.

FIG. 4A illustrates a position of the fixed data on the memory (a set of the test data and the complementary data thereof) according to the present embodiment. For example, if adjustment data of 512 bits are used, the fixed data may be mapped to the addresses 0x0000 to 0x03FF. In this case, a half of data area (512 bits) is for the complementary data. In addition, the adjustment data may be mapped to the addresses 0x0400 to 0x07FF written as the first use area of FIG. 4A. If the adjustment data is updated next time, the new data is written to the address areas 0x0800 to 0x0BFF.

FIG. 4B illustrates another mapping example of the fixed data. If the adjustment data is, for example, 4 bits fewer than 512 bits, the fixed data is embedded there. For example, if the number of differential sense amplifiers is 4 (N=4), then the sense amplifier test may be made possible by providing test data of 4 bits (for example, fixed data 1 of FIG. 4B) and complementary data of 4 bits (for example, fixed data 2 of FIG. 4B).

Thus, by writing the fixed data in the empty area of the adjustment data as shown in FIG. 4B, it is possible to secure a greater use area than the example of FIG. 4A. For example, 0x2400 to 0x27FF area is used for writing in the 9th adjustment data in FIG. 4A and is used for writing in the 10th adjustment data in FIG. 4B.

1.4.2. An Example of Sense Amplifier Test

Figure 5:
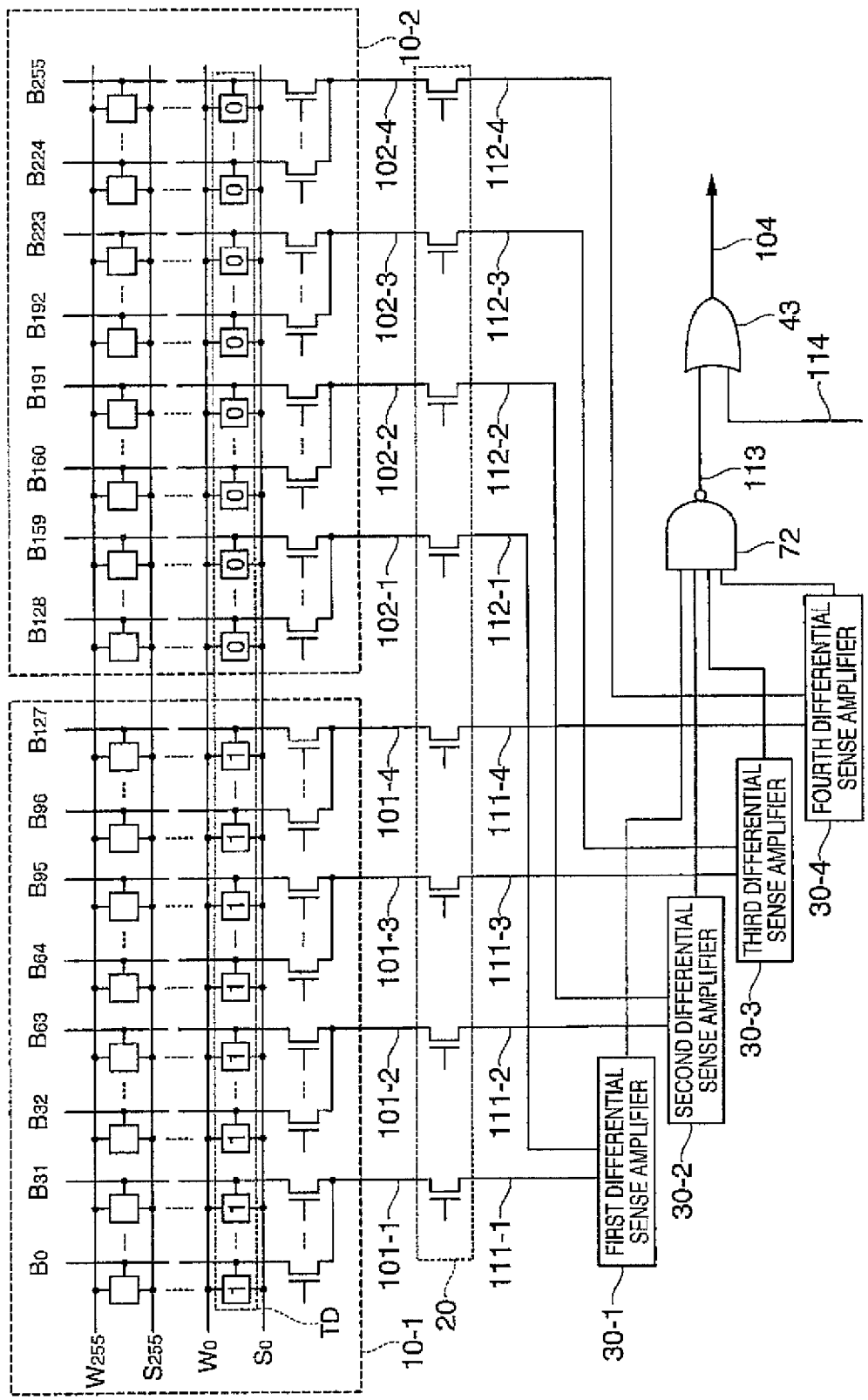
FIG. 5 is a diagram illustrating a connection state in a sense amplifier test according to the first embodiment.

FIG. 5 is a diagram illustrating how to perform the failure diagnosis of differential sense amplifiers 30-1 to 30-4 by the sense amplifier test. In the present embodiment, the non-volatile memory device 1 includes four differential sense amplifiers (N=4). Here, it is assumed that fixed data are mapped to the addresses 0x0000 to 0x03FF as shown in FIG. 4A. If the execution of the sense amplifier test is notified to the first and second blocks 10-1 and 10-2 by the control signal (not shown) or the like, for example, the 0-numbered word line $W_0$ (hereinafter, word 0) partially corresponding to the address 0x0000 to 0x03FF is selected. In this case, similar to TD of FIG. 5, the memory cell connected to the word 0 of the first block 10-1 stores 1. Then, the memory cell connected to the word 0 of the second block 10-2 stores 0.

In the sense amplifier test, failure diagnoses of the four differential sense amplifiers 30-1 to 30-4 are performed simultaneously. In the differential sense amplifiers 30-1 to 30-4, it is necessary to input each test data (1 of the fixed value) and complementary data (0 of the fixed value) thereof so that a plurality of bit lines are selected. For example, bits 0, 32, 64, 96, 128, 160, 192, and 224, ($B_0$, $B_{32}$, $B_{64}$, $B_{96}$, $B_{128}$, $B_{160}$, $B_{192}$, $B_{224}$) are selected.

The current based on the test data flows in the internal signals 101-1 to 101-4 output from the first block 10-1 and is input to the differential sense amplifiers 30-1 to 30-4 as the first input signal 111-1 to 111-4 by using the switch 20. In addition, the current based on the complementary data flows in the internal signals 102-1 to 102-4 output from the second block 10-2 and is input to the differential sense amplifiers 30-1 to 30-4 as second input signals 112-1 to 112-4 using the switch 20.

The differential sense amplifiers 30-1 to 30-4 of the present embodiment input the first input signal into the positive input terminal and input the second input signal into the negative input terminal. Therefore, if there are no failures in any of the differential sense amplifiers 30-1 to 30-4, output values of the differential sense amplifiers 30-1 to 30-4 are 1. In this case, the sense amplifier failure diagnosis signal 113 which is an output of the NAND circuit 72 becomes 0 which represents no failure. Since the memory cell failure diagnosis signal 114, the OR circuit 43, and the failure diagnosis signal 104 are similar to those described in FIG. 3, descriptions thereof will be omitted.

Here, if the sense amplifier failure diagnosis signal 113 is 1, the selected memory cell stores a fixed value. Therefore, it is possible to diagnose that a failure occurs in any one of differential sense amplifiers 30-1 to 30-4.

The sense amplifier test may be performed repeatedly by changing the selected bit line. For example, the sense amplifier test may be repeated by incrementing the number of selected bit lines by one until all the bit lines are selected. By performing such a sense amplifier test independently from the memory cell test, it is possible to distinguish between the failure of the sense amplifier and the failure of the memory cell. In addition, if it is diagnosed that the sense amplifier has failed in the sense amplifier test, the subsequent failure diagnosis of the memory cell may be aborted.

1.5 Memory Cell Test

Figure 6A:
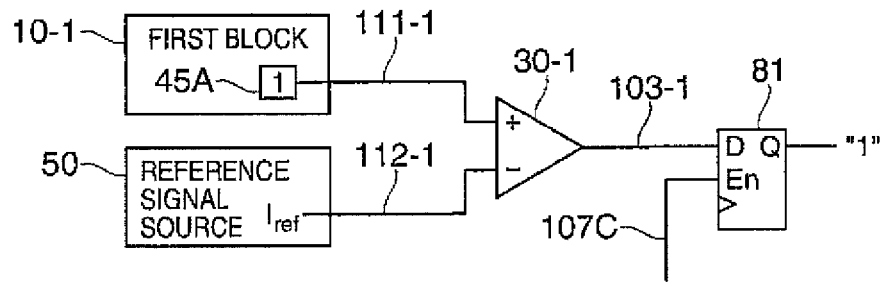
FIG. 6A to FIG. 6C are diagrams illustrating connection states of first to third memory cell tests according to the first embodiment.
Figure 6B:
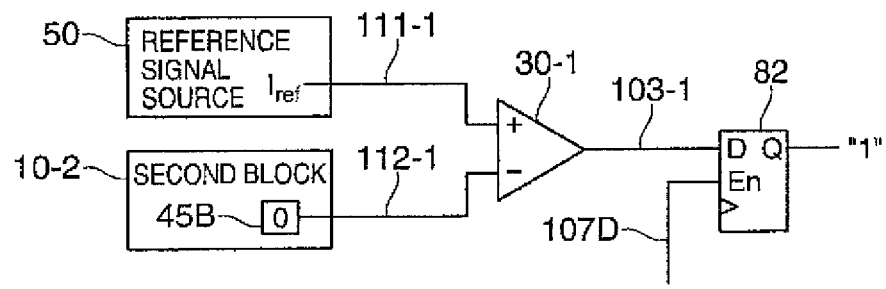
Figure 6C:
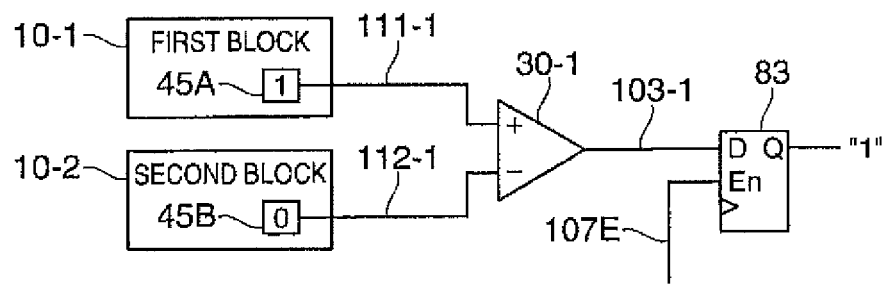

FIGS. 6A to 6C illustrate the first to third memory cell tests according to the present embodiment, in particular, a connection state in the switch 20. In addition, here, although the first differential sense amplifier 30-1 is illustrated, the present embodiment may be similarly applied to other differential sense amplifiers. First to third memory cell tests are performed subsequent to the sense amplifier test. The target memory cell of the failure diagnosis is the memory cell which stores the adjustment data. For example, if rewriting is not performed, the target memory cell is each of memory cells corresponding to the addresses 0x0400 to 0x07FF of FIG. 4A. In this case, through the first to third memory cell tests, the failure diagnosis is performed for the first memory cell which stores data of 1 bit (focus data) of the adjustment data and for the second memory cell which stores complementary data for complementing to the focus data. In addition, the failure diagnosis is executed for all memory cells that store the adjustment data (and the complementary data) while the focus data is updated.

The first and second memory cell tests are performed to diagnose a failure in which both the focus data and the complementary data are 0 or 1. For example, even when both the focus data and the complementary data are 0, it is likely that an expected value may be erroneously output due to a minute difference when the signal based on these data is input to the differential sense amplifier. In this case, the failure is not detected, and the non-volatile memory device 1 including a failed cell is continuously used so that a reliability problem occurs.

FIG. 6A illustrates a case where the first memory cell test is executed. A failure diagnosis of the first memory cell 45A which stores the focus data (1 in this embodiment) included in the first block 10-1 is executed. The control circuit 90 inputs the current based on the focus data as the first input signal 111-1 using the switch 20 (refer to FIG. 1) and inputs the current having a reference level $I_{ref}$ from the reference signal source 50 as the second input signal 112-1. Although the first differential sense amplifier 30-1 generates the output value 103-1 based on the difference thereof, in this example, the output of the flip-flop 81 is 1 if there is no failure. In addition, the control signal 107C and the flip-flop 81 are the same elements as those described in FIG. 3, and descriptions thereof will be omitted.

FIG. 6B illustrates a case where the second memory cell test is executed. A failure diagnosis of the second memory cell 45B which stores the complementary data (in this example, 0) included in the second block 10-2 is executed. The control circuit 90 inputs the current having a reference level $I_{ref}$ from the reference signal source 50 as the first input signal 111-1 and inputs the current based on the complementary data as the second input signal 112-1 using the switch 20 (refer to FIG. 1). Although the first differential sense amplifier 30-1 generates the output value 103-1 based on these difference, in this example, the output of a flip-flop 82 is 1 if there is no failure.

In addition, the control signal 107D and the flip-flop 82 are same elements as those described in FIG. 3, and description thereof will be omitted.

Here, if both values held in the flip-flops 81 and 82 are 1, the output of the XOR circuit 84 (refer to FIG. 3) becomes 0. As a result, it is possible to diagnose a failure in which both the focus data and the complementary data, are 1 (or 0). In addition, if the focus data is 0, and there is no failure, both values held in the flip-flops 81 and 82 become 0. In this case, it is possible to perform the failure diagnosis using the output of the XOR circuit 84 (refer to FIG. 3).

FIG. 6C illustrates a case where a third memory cell test is executed. In the third memory cell test, a diagnosis is performed for a failure in two memory cells 45A and 45B which store the focus data and the complementary data, for example, a failure that the data is inverted. The control circuit 90 inputs the current based on the focus data as the first input signal 111-1 using the switch 20 (refer to FIG. 1) and inputs the current based on the complementary data as the second input signal 112-1. Although the first differential sense amplifier 30-1 generates the output value 103-1 based on these difference, in this example, the output of the flip-flop 83 is 1 if there is no failure. In addition, the control signal 107E and the flip-flop 83 are same elements as those described in FIG. 3, and description thereof will be omitted.

If both values held in the flip-flops 81 and 83 are 1, the output of the XOR circuit 85 (refer to FIG. 3) becomes 0. That is, since the focus data (1) is read correctly, there is no failure. In addition, since a value of the flip-flop 83 is the same as the focus data (1) if there is no failure, the value is input to a rear-stage register 60 (refer to FIG. 1). The XOR circuit 86 (refer to FIG. 3) may be used to diagnose whether or not writing to the register 60 is appropriate.

1.6. Execution Timing of Failure Diagnosis

Figure 7A:
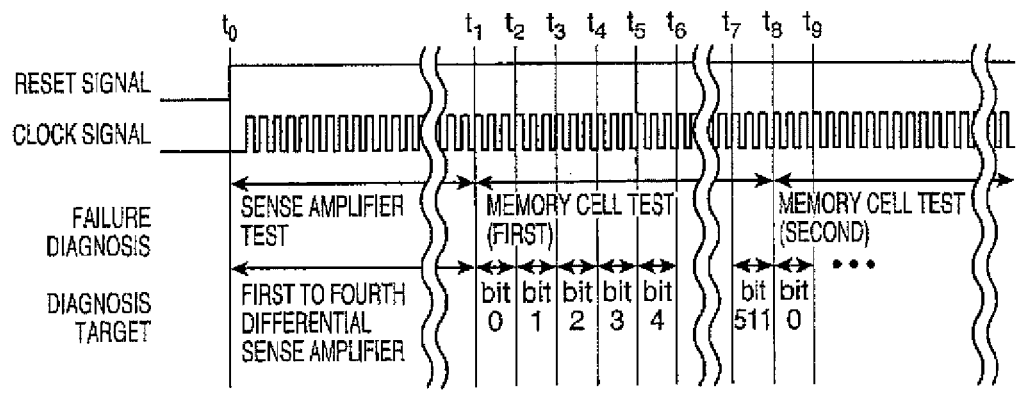
FIG. 7A is a diagram illustrating a test execution state of the non-volatile memory device after power on according to the first embodiment.

FIG. 7A illustrates a test execution state after power on of the non-volatile memory device 1 according to the present embodiment. After power on, the sense amplifier test, which is a failure diagnosis of the sense amplifier commonly used in a data reading, is executed first ($t_0$ to $t_1$). Then, the memory cell test is executed. The memory cell test is executed sequentially from bit 0 of the adjustment data. First to third memory cell tests are executed at every single cycle for 1 bit of the adjustment data ($t_1$ to $t_2$). In addition, the memory cell test is executed in the order of bit 1 ($t_2$ to $t_3$), bit 2 ($t_3$ to $t_4$), bit 3 ($t_4$ to $t_5$), and bit 4 ($t_5$ to $t_6$) of the adjustment data. In addition, the memory cell test is executed for the last bit 511 of the adjustment data ($t_7$ to $t_8$), and then, the process returns to bit 0 so that the second memory cell test is repeated ($t_8$ to $t_9$). As a result, it is possible to implement a failure diagnosis with high reliability by executing the memory cell test at all times after power on. In addition, before the beginning of the second memory cell test, the sense amplifier test may be performed again.

If it is diagnosed that a failure occurs, the failure diagnosis signal 104 (refer to FIG. 1) is changed to 1. If the failure diagnosis signal 104 is changed to 1 during execution of the sense amplifier test ($t_0$ to $t_1$), it indicates that a failure occurs in any one of the first to fourth differential sense amplifiers 30-1 to 30-4.

Figure 7B:
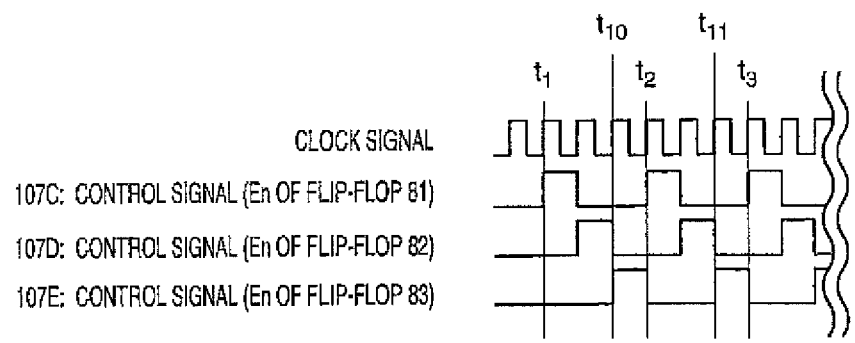
FIG. 7B is an enlarged view illustrating the execution state at the time of the memory cell test.

FIG. 7B illustrates the control signals 107C to 107E by enlarging the part ($t_1$ to $t_3$) during execution of the memory cell test of FIG. 7A. The control signals 107C to 107E control update timings of the flip-flops 81 to 83, respectively. Here, it is necessary to perform the diagnosis by pairing the results of the first memory cell test and the second memory cell test using the XOR circuit 84. In the example of FIG. 7B, it is preferable to determine the failure at the timing of $t_{10}$ or $t_{11}$ which finishes the second memory cell test using the failure diagnosis signal 104. In addition, in the third memory cell test, it is preferable to determine the failure at the timing of $t_2$ or $t_3$.

By executing the failure diagnosis in this manner, it is possible to distinguish between the failure of the sense amplifier and the failure of the memory cell, and it is possible to implement the failure diagnosis with high reliability while executing the memory cell test at all times. In addition, since the failure diagnosis is performed on a single-bit basis, it is unlikely to increase a circuit size for comparison.

2. Modified Example

A modified example of the first embodiment will be described with reference to FIGS. 8A and 8B. In addition, the configuration is the same as the first embodiment, like reference numerals denote like elements as in FIGS. 1 to 7B and detailed description thereof is omitted, and only points of difference will be described.

Figure 8A:
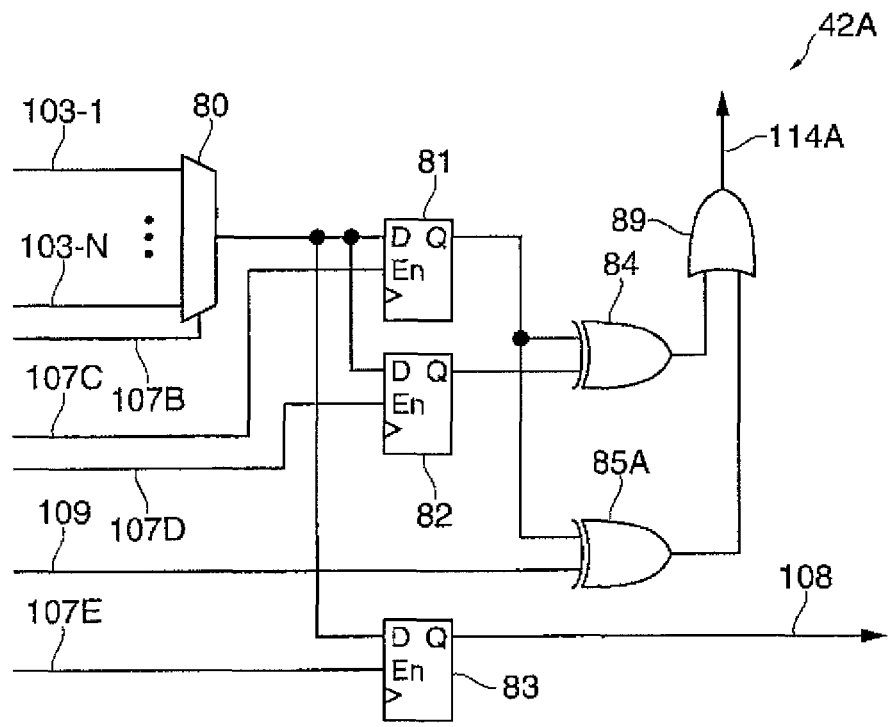
FIG. 8A and FIG. 8B are diagrams of a memory cell test circuit according to a modified example.

The memory cell test circuit 42 of the first embodiment may be modified to a memory cell test circuit 42A of FIG. 8A. In the first embodiment, a comparison between the diagnosis target register value 109 and the value held in the flip-flop 83, which is a source data, is performed by the XOR circuit 86. However, in this modification example, whether or not writing to the register 60 is appropriately performed is diagnosed by directly comparing the diagnosis target register value 109 with the value held in the flip-flop 81, that is, an output value of the differential sense amplifier in the first memory cell test (XOR circuit 85A). In this case, since the XOR circuit 86 may be omitted, it is possible to decrease the circuit size.

On the other hand, in order to further increase the reliability of the failure diagnosis, all of XOR circuit 85A and XOR circuits 85 and 86 (refer to FIG. 3) of the first embodiment may be used in diagnosis. In this case, the OR circuit 89 receives the output of XOR circuits 84, 85, 86, and 85A, and a memory cell failure diagnosis signal 114A is changed to 1 if there is any failure. Although the circuit size increases, it is possible to maximize the reliability.

Figure 8B:
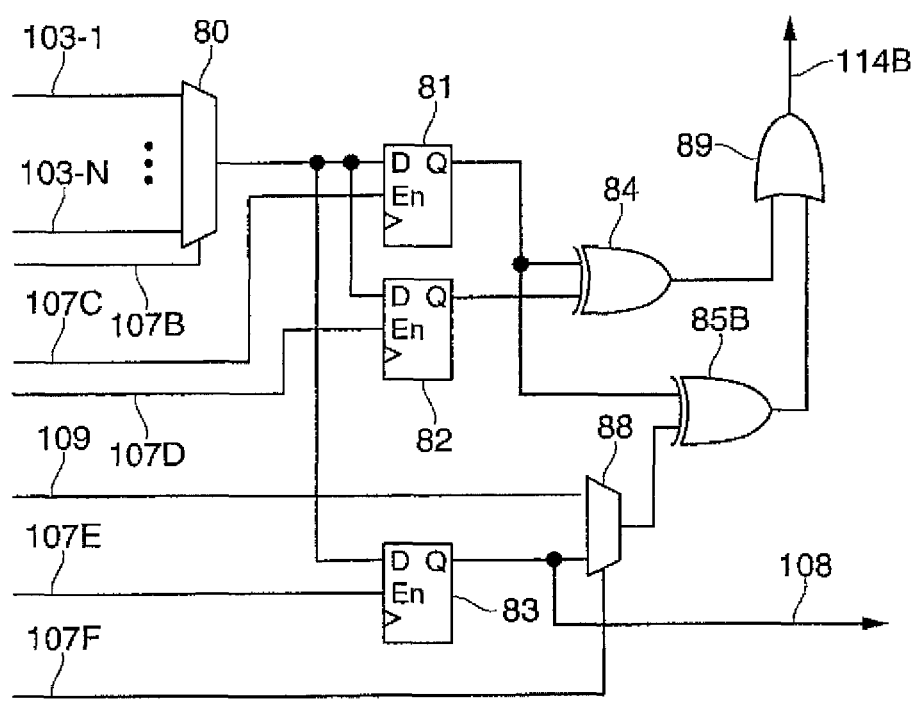

In addition, the memory cell test circuit 42 of the first embodiment may be modified to a memory cell test circuit 42B of FIG. 8B. Using a selection device 88, a comparison between the value held in the flip-flop 81 and a selection one of the diagnosis target register value 109 and the value held in the flip-flop 83 may be performed (XOR circuit 85B). In this case, for example, in the initial memory cell test after power on, it is determined whether or not writing to the register 60 is appropriately performed, and then, it is possible to perform a failure diagnosis for the output value of the differential sense amplifier. This configuration makes it possible to perform a failure diagnosis which includes a register as necessary. In addition, a control signal 107F may be a selection signal of the selection device 88. The control signal 107F may change, for example, based on the value of the counter which counts the number of memory cell tests in the control circuit 90. In addition, memory cell failure diagnosis signals 114A and 114E of FIGS. 8A and 8B correspond to the memory cell failure diagnosis signal 114 of the first embodiment.

3. Application Example

The application example of the first embodiment will be described with reference to FIG. 9. The non-volatile memory device 1 is capable of the failure diagnosis with high reliability and may be applied to electronic apparatus mounted on a vehicle, an airplane, a ship, a train, or the like which requires safety.

Figure 9:
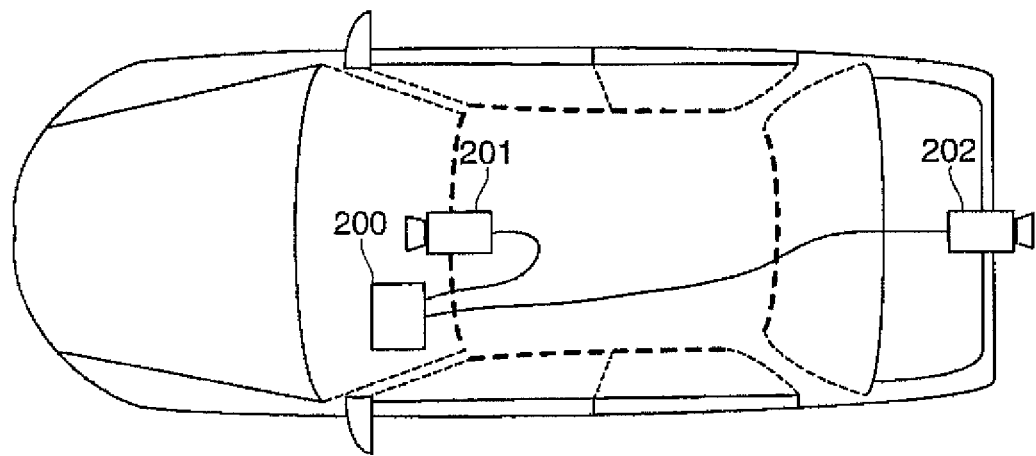
FIG. 9 is a diagram illustrating a drive recorder which is an example of an electronic apparatus in an application example.

FIG. 9 illustrates a drive recorder 200 which is an example of the electronic apparatus in the application example. The drive recorder 200 is, for example, a device which stores necessary information by processing images of a front camera 201 and a rear camera 202 mounted on the vehicle. For example, in order to optimize brightness and colors of images from the front camera 201 and the rear camera 202, adjustment data for an analog circuit may be necessary. In this case, if the adjustment data is output to the image processing unit using the non-volatile memory device 1 of the present embodiment in the drive recorder 200, it is possible to provide the adjustment data with high reliability.

Furthermore, without being limited to the drive recorder 200, the non-volatile memory device 1 may be used in electronic apparatus in an airbag system or a brake system which directly affects vehicle safety.

It is noted that the invention is not limited to the above-described embodiments, but can be modified in various ways. For example, the invention includes configurations substantially the same as the configuration explained in the embodiments (e.g. a configuration with the same function, method, and result, or a configuration with the same object and effectiveness). Furthermore, the invention includes configurations obtained by replacing a non-essential part of the configuration explained in the embodiments. Also, the invention includes configurations capable of providing the same effectiveness or of achieving the same object as the configurations explained in the embodiments. In addition, the invention includes configurations obtained by adding related art to the configurations explained in the embodiments.

What is claimed is:

1. A non-volatile memory device comprising:
    a first block including first memory cells that store a first data group including test data on a single-bit basis;
    a second block including second memory cells that store a second data group including data complementary to each data of the first data group on a single-bit basis;
    at least one switch that receives a first input signal and a second input signal;
    a differential sense amplifier that receives the first and second input signals and generates an output value based on a difference therebetween;
    a diagnostic circuit that performs a failure diagnosis using the output value of the differential sense amplifier; and
    a control circuit that uses the at least one switch to perform selection of the first and second input signals and control of the diagnostic circuit,
    wherein the control circuit performs control such that a signal based on the test data is set to the first input signal, a signal based on the data complementary to the test data out of the second data group is set to the second input signal, and the diagnostic circuit executes a sense amplifier test which is a failure diagnosis of the differential sense amplifier, and
    the diagnostic circuit executes a sense amplifier test using the output value of the differential sense amplifier.

2. The non-volatile memory device according to claim 1, wherein the test data is a fixed value.

3. The non-volatile memory device according to claim 1, further comprising a reference signal source for outputting a reference signal,
    wherein the control circuit performs control such that the diagnostic circuit executes first to third memory cell tests after executing the sense amplifier test,
    in a case of the first memory cell test, a signal based on focus data which is data of one bit other than the test data out of the first data group is set to the first input signal, and the reference signal is set to the second input signal,
    in a case of the second memory cell test, the reference signal is set to the first input signal, and a signal based on a complementary data which complements the focus data out of the second data group is set to the second input signal,
    in a case of the third memory cell test, a signal based on the focus data is set to the first input signal, and a signal based on the complementary data is set to the second input signal, and
    the focus data changes to repeat the first to third memory cell tests until a predetermined condition is satisfied, and
    wherein the diagnostic circuit executes the first memory cell test which is a failure diagnosis of the first memory cell which stores the focus data, executes the second memory cell test which is a failure diagnosis of the second memory cell which stores the complementary data, and executes the third memory cell test which is a failure diagnosis of the first memory cell which stores the focus data and the second memory cell which stores the complementary data after executing the first and second memory cell tests.

4. The non-volatile memory device according to claim 3, wherein the diagnostic circuit executes each of first to third memory cell tests in a single clock cycle.

5. The non-volatile memory device according to claim 3, wherein the diagnostic circuit changes a failure diagnosis signal if it is diagnosed that a failure occurs in any one of the sense amplifier test and the first to third memory cell tests.

6. The non-volatile memory device according to claim 3, further comprising a register which holds a value based on an output value of the differential sense amplifier if the third memory cell test is executed,
    wherein the diagnostic circuit performs a failure diagnosis using a value held in the register.

7. The non-volatile memory device according to claim 6, wherein the diagnostic circuit executes the third memory cell test by selecting one of an output value of the differential sense amplifier and values held in the register and performs the third memory cell test using each value held in the register only one time after power on.

8. An electronic apparatus comprising the non-volatile memory device according to claim 1.

9. An electronic apparatus comprising the non-volatile memory device according to claim 2.

10. An electronic apparatus comprising the non-volatile memory device according to claim 3.

11. An electronic apparatus comprising the non-volatile memory device according to claim 4.

12. An electronic apparatus comprising the non-volatile memory device according to claim 5.

13. An electronic apparatus comprising the non-volatile memory device according to claim 6.

14. An electronic apparatus comprising the non-volatile memory device according to claim 7.

* * * * *